(12) United States Patent
Xiao et al.

(10) Patent No.: US 11,404,446 B2
(45) Date of Patent: Aug. 2, 2022

(54) DISPLAY PANEL, GATE ELECTRODE DRIVING CIRCUIT, AND ELECTRONIC DEVICE

(71) Applicant: WUHAN CHINA STAR OPTOELECTRONICS TECHNOLOGY CO., LTD., Hubei (CN)

(72) Inventors: Juncheng Xiao, Hubei (CN); Chao Tian, Hubei (CN); Yanqing Guan, Hubei (CN); Haiming Cao, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 120 days.

(21) Appl. No.: 16/769,254

(22) PCT Filed: Feb. 28, 2020

(86) PCT No.: PCT/CN2020/077226
§ 371 (c)(1),
(2) Date: Jun. 3, 2020

(87) PCT Pub. No.: WO2021/159563
PCT Pub. Date: Aug. 19, 2021

(65) Prior Publication Data
US 2021/0408072 A1 Dec. 30, 2021

(30) Foreign Application Priority Data
Feb. 12, 2020 (CN) .......................... 202010089264.4

(51) Int. Cl.
*H01L 27/12* (2006.01)
*G09G 3/20* (2006.01)

(52) U.S. Cl.
CPC ....... *H01L 27/1225* (2013.01); *G09G 3/2092* (2013.01); *H01L 27/1237* (2013.01); *H01L 27/1251* (2013.01); *G09G 2310/0267* (2013.01)

(58) Field of Classification Search
CPC ............ H01L 27/1225; H01L 27/1237; H01L 27/1251; G09G 2310/0267;
(Continued)

(56) References Cited

U.S. PATENT DOCUMENTS 10,490,128 B1    11/2019   Qian et al.
2019/0204668 A1   7/2019   Yang
(Continued)

FOREIGN PATENT DOCUMENTS

CN    108231795 A    6/2018
CN    108288621 A    7/2018
(Continued)

*Primary Examiner* — Nikolay K Yushin
(74) *Attorney, Agent, or Firm* — Soroker Agmon Nordman

(57) ABSTRACT

A display panel, a gate electrode driving circuit, and an electronic device are provided. The display panel includes a first metal layer including a first gate electrode; a second metal layer including a first source electrode, a first drain electrode, and a second gate electrode; two ends of a polycrystalline silicon semiconductor layer electrically connected to the first source electrode and the first drain electrode respectively; a third metal layer including a second source electrode and a second drain electrode; and two ends of a metal oxide semiconductor layer electrically connected to the second source electrode and the second drain electrode respectively.

18 Claims, 6 Drawing Sheets

(58) Field of Classification Search
CPC ... G09G 2310/0268; G09G 2310/0286; G09G 2310/0275; G09G 3/3266; G09G 3/2092; G09G 3/3677; G09G 3/3268; G09G 3/3275; G09G 3/3225

See application file for complete search history.

(56) References Cited

U.S. PATENT DOCUMENTS

| | | |
|---|---|---|
| 2019/0214447 A1 | 7/2019 | Kim et al. |
| 2020/0035181 A1 | 1/2020 | Zhang et al. |
| 2020/0226993 A1 | 7/2020 | Gunasekara et al. |

FOREIGN PATENT DOCUMENTS

| | | |
|---|---|---|
| CN | 108877626 A | 11/2018 |
| CN | 109036303 A | 12/2018 |
| CN | 109036304 A | 12/2018 |
| CN | 109300915 A | 2/2019 |
| CN | 110534531 A | 12/2019 |
| CN | 110570818 A | 12/2019 |
| CN | 110620119 A | 12/2019 |
| CN | 110634888 A | 12/2019 |
| TW | 201941180 A | 10/2019 |

DISPLAY PANEL, GATE ELECTRODE DRIVING CIRCUIT, AND ELECTRONIC DEVICE

FIELD OF INVENTION

The present disclosure relates to the field of display technology, and particularly relates to a display panel, a gate electrode driving circuit, and an electronic device.

BACKGROUND OF INVENTION

Two technologies of low temperature polycrystalline silicon (LTPS) and metal oxide are integrated into a low temperature polycrystalline oxide (LTPO) technology, that is, simultaneously forming a first thin film transistor and a second thin film transistor in a same display panel.

Using the LTPO technique can allow application of equipment to be extended into a field of super low frequency display to realize a purpose of optimizing power consumption. However, because holding times of nodes in a driving circuit (gate driver on array, GOA) during an implementation process of low frequency become longer, stability of circuit stage transfer is reduced and the GOA circuit is prone to failure, thereby resulting in an occurrence of split screen phenomenon and reduced display effect.

Therefore, a display panel, a gate electrode driving circuit, and an electronic device need to be provided to solve the problem existing in the prior art.

SUMMARY OF INVENTION

The purpose of the present disclosure is to provide a display panel, a gate electrode driving circuit, and an electronic device which can improve stability of circuit stage transfer and can prevent failure of the gate on array (GOA) circuit and occurrence of a split screen phenomenon, thereby improving display effect.

In order to solve the technical problem mentioned above, the present disclosure provides a display panel, which includes the display panel including a gate electrode driving region, and a sectional structure of the gate electrode driving region includes:

a polycrystalline silicon semiconductor layer;

a first metal layer disposed on the polycrystalline silicon semiconductor layer, wherein the first metal layer includes a first gate electrode;

a second metal layer disposed on the first metal layer, wherein the second metal layer includes a first source electrode, a first drain electrode, and a second gate electrode, and two ends of the polycrystalline silicon semiconductor layer are electrically connected to the first source electrode and the first drain electrode respectively;

a metal oxide semiconductor layer disposed on the second metal layer; and a third metal layer disposed on the metal oxide semiconductor layer, wherein the third metal layer includes a second source electrode and a second drain electrode, and two ends of the metal oxide semiconductor layer are electrically connected to the second source electrode and the second drain electrode respectively.

The present disclosure further provides a gate electrode driving circuit, which includes a plurality of cascading gate electrode driving units. An nth stage gate electrode driving unit includes:

a first thin film transistor, a second thin film transistor, a third thin film transistor, a fourth thin film transistor, a fifth thin film transistor, a sixth thin film transistor, and a seventh thin film transistor;

a gate electrode of the first thin film transistor is input an n−2th stage scanning signal, a source electrode of the first thin film transistor is input a first power source voltage, and a drain electrode of the first thin film transistor is connected to a first node;

a gate electrode of the second thin film transistor is input the first power source voltage, a source electrode of the second thin film transistor is connected to the first node, and a drain electrode of the second thin film transistor is connected to a gate electrode of the third thin film transistor, a source electrode of the third thin film transistor is input an nth stage clock signal, a drain electrode of the third thin film transistor is connected to a first output end, wherein the first output end is used to output the nth stage scanning signal;

a gate electrode of the seventh thin film transistor is input an n+1th stage clock signal, a source electrode of the seventh thin film transistor is input the first power source voltage, and a drain electrode of the seventh thin film transistor is connected to a second node;

a gate electrode of the sixth thin film transistor is connected to the drain electrode of the first thin film transistor, a drain electrode of the sixth thin film transistor is connected to the second node, and a source electrode of the sixth thin film transistor is input a second power source voltage;

a gate electrode of the fifth thin film transistor is connected to the second node, a drain electrode of the fifth thin film transistor is connected to the first node, and a source electrode of the fifth thin film transistor is input the second power source voltage;

a gate electrode of the fourth thin film transistor is connected to the second node, a drain electrode of the fourth thin film transistor is connected to the first output end, and a source electrode of the fourth thin film transistor is input the second power source voltage, wherein a material of a semiconductor layer of the fifth thin film transistor and/or a material of a semiconductor layer of the sixth thin film transistor are metal oxides, a material of a semiconductor layer of the first thin film transistor, a material of a semiconductor layer of the second thin film transistor, a material of a semiconductor layer of the third thin film transistor, a material of a semiconductor layer of the fourth thin film transistor, and a material of a semiconductor layer of the seventh thin film transistor are polycrystalline silicon.

The present disclosure further provides an electronic device, which includes the display panel mentioned above.

The present disclosure provides the display panel, the gate electrode driving circuit, and the electronic device. The display panel includes the gate electrode driving region. The gate electrode driving region includes the polycrystalline silicon semiconductor layer; the first metal layer disposed on the polycrystalline silicon semiconductor layer, wherein the first metal layer includes a first gate electrode; the second metal layer disposed on the first metal layer, wherein the second metal layer includes the first source electrode, the first drain electrode, and the second gate electrode, and two ends of the polycrystalline silicon semiconductor layer are electrically connected to the first source electrode, and the first drain electrode respectively; and the third metal layer disposed on the metal oxide semiconductor layer, wherein the third metal layer includes the second source electrode and the second drain electrode, and two ends of the metal oxide semiconductor layer are electrically connected to the second source electrode and the second drain electrode respectively. Because the metal oxide semiconductor layer is added, an off-state current of the corresponding thin film transistor is less than a preset value. Therefore, a leakage current is reduced, which can improve stage transfer stability of the GOA circuit and can prevent failure of the GOA circuit and occurrence of a split screen phenomenon, thereby improving display effect.

DETAILED DESCRIPTION OF PREFERRED EMBODIMENT

Figure 1:
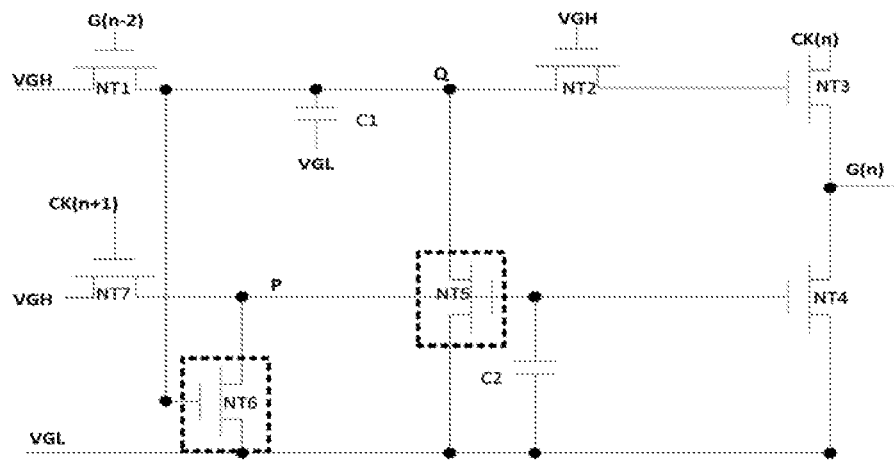
FIG. 1 is a structural schematic diagram of a gate electrode driving circuit in the prior art.

The descriptions of embodiments below refer to accompanying drawings in order to illustrate certain embodiments which the present disclosure can implement. The directional terms of which the present disclosure mentions, for example, "top", "bottom", "front", "rear", "left", "right", "inside", "side", etc., only refer to directions of the accompanying figures. Therefore, the used directional terms are for illustrating and understanding the present disclosure, but not for limiting the present disclosure. In the figures, units with similar structures are indicated by the same reference numerals.

The terms "first", "second", etc. in the specification, claims, and the accompanying drawings mentioned above of the present disclosure are used to distinguish similar objects, and are not used to describe a particular order. Moreover, the terms "comprising" and "having" and any deformation of them are intended to cover non-exclusive inclusions.

As illustrated in FIG. 1, a gate electrode driving circuit in the prior art includes a first thin film transistor NT1 to a seventh thin film transistor NT7. A gate electrode of the first thin film transistor NT1 is input an n−2th stage scanning signal G(n−2). A source electrode of the first thin film transistor NT1 is input a first power source voltage VGH. A drain electrode of the first thin film transistor is connected to a first node Q. A gate electrode of the second thin film transistor NT2 is input the first power source voltage VGH. A source electrode of the second thin film transistor NT2 is connected to the first node Q. A drain electrode of the second thin film transistor NT2 is connected to a gate electrode of the third thin film transistor NT3. A source electrode of the third thin film transistor NT3 is input an nth stage clock signal CK(n). A drain electrode of the third thin film transistor NT3 is connected to a first output end. The first output end outputs the nth stage scanning signal G(n).

A gate electrode of the seventh thin film transistor NT7 is input an n+1th stage clock signal CK(n+1). A source electrode of the seventh thin film transistor NT7 is input the first power source voltage VGH. A drain electrode of the seventh thin film transistor NT7 is connected to a second node P. A gate electrode of the sixth thin film transistor NT6 is connected to the drain electrode of the first thin film transistor NT1. A drain electrode of the sixth thin film transistor NT6 is connected to the second node P. A source electrode of the sixth thin film transistor NT6 is input a second power source voltage VGL A gate electrode of the fifth thin film transistor NT5 is connected to the second node P. A drain electrode of the fifth thin film transistor NT5 is connected to the first node Q. A source electrode of the fifth thin film transistor NT5 is input the second power source voltage VGL.

A gate electrode of the fourth thin film transistor NT4 is connected to the second node P. A drain electrode of the fourth thin film transistor NT4 is connected to the first output end. A source electrode of the fourth thin film transistor NT4 is input the second power source voltage VGL.

An end of a first capacitor C1 is connected to the drain electrode of the first thin film transistor NT1. Another end of the first capacitor C1 is input the second power source voltage VGL.

An end of a second capacitor C2 is connected to a second node P. Another end of the second capacitor C2 is input the second power source voltage VGL.

Furthermore, the fifth thin film transistor NT5 is used to drop down an electric potential of the node Q, and the sixth thin film transistor NT6 is used to drop down an electric potential of the node P.

Figure 2:
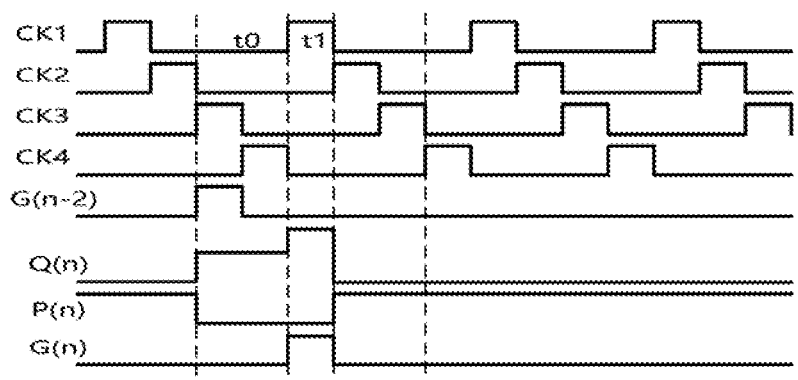
FIG. 2 is a first working sequence diagram of the current gate electrode driving circuit in the prior art.

As illustrated in FIG. 2, wherein CK1 to CK4 indicate clock signals, Q(n) indicates the signal of the nth stage gate electrode driving unit at the node Q, P(n) indicates the signal of the nth stage gate electrode driving unit at the node P, t0 is a charging time of the nth stage gate electrode driving unit at node Q, t1 is a boost time of the nth stage gate electrode driving unit at node Q, and high electric potential is held at the node P when the low electric potential is at node Q.

Figure 3:
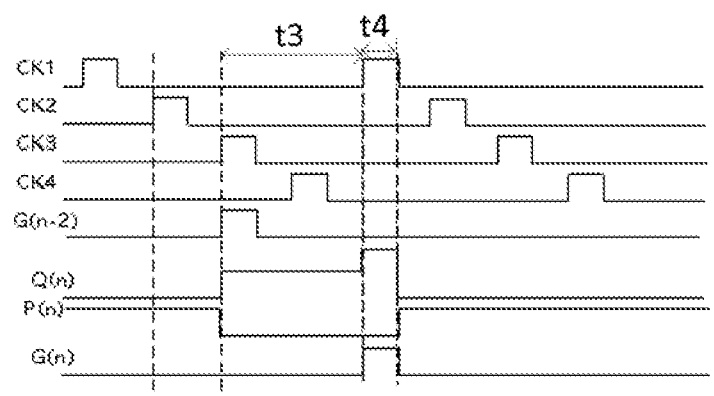
FIG. 3 is a second working sequence diagram of the current gate electrode driving circuit in the prior art.

One of low-frequency driving methods is to increase interval between clock signals. Taking 1 Hz as an example, as illustrated in FIG. 3, which is a time sequence schematic diagram of 4 clocks (CKs) of the circuit driven by low frequency, wherein t3 is a charging time of the nth stage gate electrode driving unit at node Q, t4 is a boost time of the nth stage gate electrode driving unit at node Q, and high electric potential is held at the node P when the node Q is at a low electric potential. When working at low frequency (for example 1 Hz), a time section of a high electric level at the node Q is t3+t4, and wherein t3+t4 is greater than t0+t1. When the thin film transistor NT5 is in an off-state, a certain leakage current still exists, thereby reducing the stage transfer stability of a GOA circuit. Hence, it can be understood that the off-state current $I_{off}$ of NT5 affects stability of the GOA circuit directly.

Another low-frequency driving method is when a frame is scanned at 60 Hz, low electric levels are output by every stage of the GOA units. In this situation, high electric potential need to be constantly held at the node P, and compared to the situation of 60 Hz, the time would be prolonged greatly. However, when the thin film transistor NT6 is in an off-state, a certain leakage current still exists, thereby increasing risk of outputting floating values to affect display effect. It can be understood that the off-state current $I_{off}$ of NT6 affects stability of the GOA circuit directly.

Figure 4:
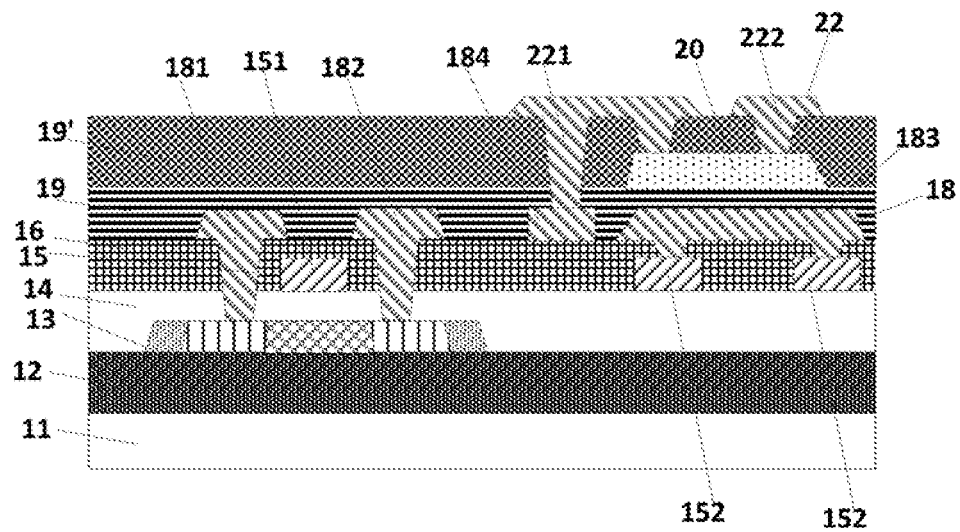
FIG. 4 is a structural schematic diagram of a display panel of an embodiment of the present disclosure.

Please refer to FIG. 4, FIG. 4 is a structural schematic diagram of a display panel of an embodiment of the present disclosure.

The display panel of this embodiment includes a base substrate 11, and a buffer layer 12, a polycrystalline silicon semiconductor layer 13, a first insulation layer 14, a first metal layer 15, a gate insulation layer 16, a second metal layer 18, a second insulation layer 19, a third insulation layer 19', a metal oxide semiconductor layer 20, and a third metal layer 22 which are disposed on the base substrate 11 sequentially, and a fourth insulation layer and a pixel electrode may be further included.

In an embodiment, the base substrate 11 can be a glass substrate.

In an embodiment, in order to improve conductivity performance of the thin film transistor, a material of the polycrystalline silicon semiconductor layer 13 is polycrystalline silicon.

The first metal layer 15 includes a first gate electrode 151, and the first metal layer 15 can further include two first connection parts 152. That is, the first gate electrode 151 and the first connection parts 152 are located on a same metal layer. Therefore, production processes can be simplified. Furthermore, a number of the first connection parts is not limited thereto.

The gate insulation layer 16 is disposed between the first metal layer 15 and the second metal layer 18. A first connection hole (not shown in the figure) is defined on the gate insulation layer 16. The second gate electrode 183 is connected to the first connection part 152 through the first connection hole.

Furthermore, a plurality of first contact holes are defined on the first insulation layer 14 and the gate insulation layer 16. The first source electrode 181 and the first drain electrode 182 are connected to the polycrystalline silicon semiconductor layer 13 by one of the first contact holes.

The second metal layer 18 includes a first source electrode 181, a first drain electrode 182, and a second gate electrode 183. Furthermore, the polycrystalline silicon semiconductor layer 13, the first gate electrode 151, the first source electrode 181, and the first drain electrode 182 constitute a low-temperature polycrystalline-silicon thin film transistor. That is, the first source electrode 181, the first drain electrode 182, and the second gate electrode 183 are disposed on a same metal layer (the second metal layer). Therefore, the production process can be simplified. In other embodiment, the first source electrode 181, the first drain electrode 182, and the second gate electrode 183 can be located on different metal layers.

The second gate electrode 183 is connected to the first connection part 152. The first connection part 152 is used to make the polycrystalline silicon thin film transistor connect with the second gate electrode 183. A number of the first connection parts 152 can also be plural or singular.

In addition, the second metal layer 18 can further include a second connection part 184. It can be understood that a number of the second connection parts can be plural.

In an embodiment, a material of the metal oxide semiconductor layer can include one of indium gallium zinc oxide (IGZO), indium gallium zinc tin oxide (IGZTO), or indium tin zinc oxide (ITZO), thereby further reducing the off-state current of the metal oxide thin film transistor T2.

In an embodiment, the second insulation layer 19 is disposed between the second metal layer 18 and the metal oxide semiconductor layer 20. The third insulation layer 19' is disposed between the metal oxide semiconductor layer 20 and the third metal layer 22. The second connection hole penetrates the second insulation layer 19 and the third insulation layer 19'. A plurality of second contact holes are defined on the second insulation layer 19 (not shown in the figure). A second source electrode 221 and a second drain electrode 222 are respectively electrically connected to the metal oxide semiconductor layer 20 through one of the second contact holes. In other embodiment, the second drain electrode 222 is also connected to the second connection part 184 through one of the second connection holes. The second connection part 184 is conducive to the polycrystalline silicon thin film transistor connecting to at least one of the second source electrode or the second drain electrode.

The third metal layer 22 includes the second source electrode 221 and the second drain electrode 222. The second source electrode 221 and/or the second drain electrode 222 are connected to one of the second connection parts 184. The second gate electrode 183, the second source electrode 221, the second drain electrode 222, and the metal oxide semiconductor layer 20 constitute a metal oxide thin film transistor.

In other embodiment, a laminated sequence of the film layers of the gate electrode driving region is not limited thereto. In can be understood that a panel structure of a region outside of the gate electrode driving region is same as a structure in the prior art, and redundant description will not be mentioned herein.

Because the metal oxide thin film transistor is added in the gate electrode driving region, an off-state current of the corresponding thin film transistor is less than a preset value. Therefore, a leakage current can be reduced to improve stage transfer stability and display effect of the GOA.

Figure 5:
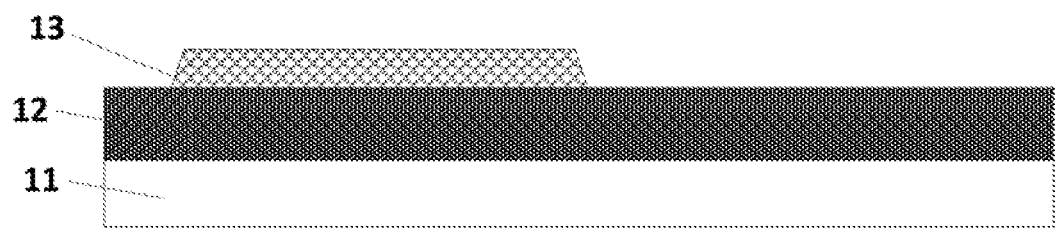
FIG. 5 is a structural schematic diagram of a first step of a manufacturing method of the display panel of the present disclosure.

The present disclosure further provides a manufacturing method of the display panel, including:

S101: manufacturing a polycrystalline silicon semiconductor layer on a base substrate;

In an embodiment, the base substrate 11 being a glass substrate is taken as an example. As illustrated in FIG. 5, for example, after cleaning and pre-baking the glass substrate, buffer materials are deposited on the glass substrate to form the buffer layer 12. A material of the buffer layer 12 may include at least one of SiNx or $SiO_2$. Afterwards, depositing amorphous silicon (a-Si) on the buffer layer 12, then performing a rapid thermal annealing process or a laser crystallization process on the a-Si to make the a-Si transform into polycrystalline silicon (poly-Si), that is, a polycrystalline silicon layer is obtained. Afterwards, using a photo process and an etching process to process the polycrystalline silicon layer, and defining a pattern of the semiconductor layer to obtain a patterned polycrystalline silicon semiconductor layer 13. It can be understood that a material of the polycrystalline silicon semiconductor layer 13 is not limited thereto.

Figure 6:
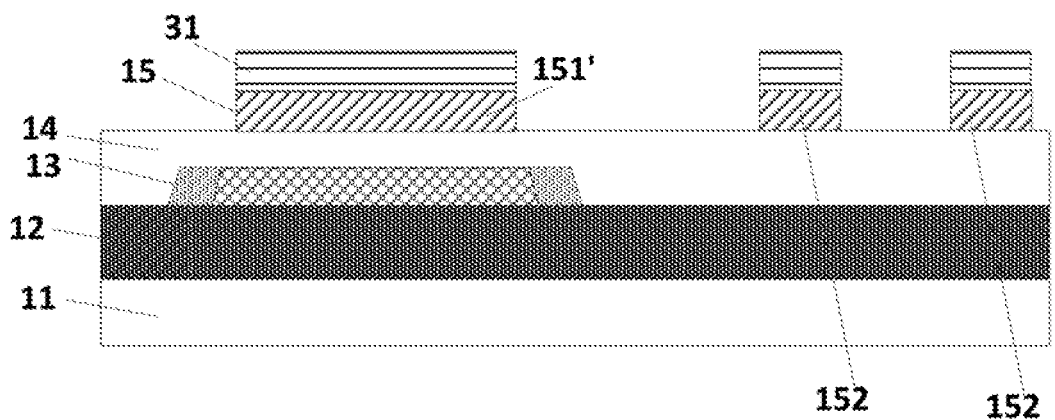
FIG. 6 is a structural schematic diagram of a first substep of a second step of the manufacturing method of the display panel of the present disclosure.

S102: manufacturing a first metal layer on the polycrystalline silicon semiconductor layer;

Illustrated in FIG. 6 is manufacturing a first insulation layer 14 on the polycrystalline silicon semiconductor layer 13. The first insulation layer 14 is a single-layer film or a multi-layer film. A material of the first insulation layer 14 may include at least one of SiNx or SiO$_2$.

Figure 7:
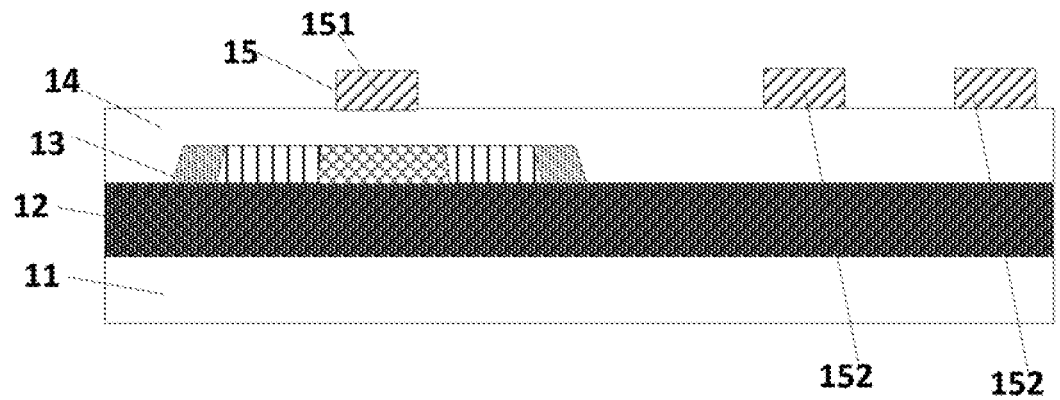
FIG. 7 is a structural schematic diagram of a second substep of the second step of the manufacturing method of the display panel of the present disclosure.

Combined with FIG. 7, afterwards depositing the first metal layer 15 on the first insulation layer 14, and performing a patterning process on the first metal layer 15 to obtain the first gate electrode 151 and the first connection part 152.

Specifically, manufacturing a photoresist layer 31 on the first metal layer 15, performing a patterning process on the photoresist layer 31, using the patterned photoresist layer 31 to act as a blocking body to perform a first etch on the first metal layer to obtain a first part 151' and the first connection part 152. Furthermore, a procedure of the patterning process includes steps such as exposure, development, etching, etc.

Using the patterned photoresist layer 31 to act as a blocking body, and performing a first ion implanting process on the polycrystalline silicon semiconductor layer 13 on two sides of the first part 151', that is, specifically, performing a doping process on the polycrystalline silicon in the outermost side of the source/drain region to form a heavy doping region with n+ ions or p+ ions.

Combined with FIG. 7, performing a second etching on the two sides of the patterned photoresist layer 31. In the etching process, the two sides on the first part 151' are also etched away, which makes the first part 151' form into the first gate electrode 151, and afterwards the photoresist layer 31 is lifted off. Using the patterned first gate electrode 151 to act as a blocking body, and performing a second ion implanting process on the polycrystalline silicon semiconductor layer 13 on two sides of the first gate electrode 151, that is, specifically, performing a doping process on the polycrystalline silicon of a middle region of the source/drain region to form a light doping region with n– ions or p– ions. A material of the first metal layer 15 may include at least one of Mo, Al, or Cu.

Figure 8:
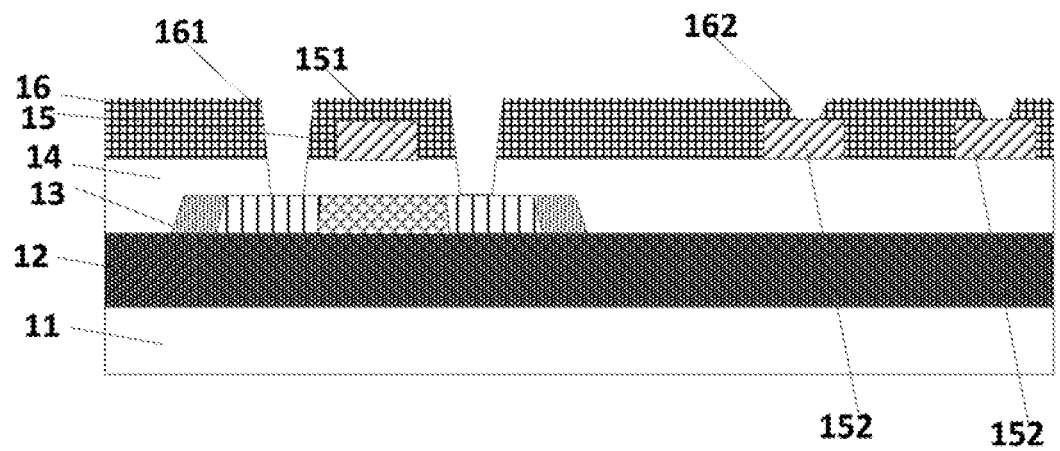
FIG. 8 is a structural schematic diagram of a third step of the manufacturing method of the display panel of the present disclosure.

S103: manufacturing a second insulation layer on the first gate electrode and the second gate electrode, wherein a plurality of first contact holes and at least one second contact hole are defined on the second insulation layer;

Illustrated in FIG. 8 is manufacturing the gate insulation layer 16 on the first gate electrode 151 and the first connection part 152, and two first contact holes 161 and two first connection holes 162 are manufactured on the gate insulation layer 16. The second gate electrode 183 is connected to the first connection part 152 through the first connection holes 162. The first source electrode 181 and the first drain electrode 182 are connected to the polycrystalline silicon semiconductor layer 13 through one of the first contact holes 161. It can be understood that a number of the first contact holes and a number of the first connection holes are not limited thereto.

S104: manufacturing a second metal layer on the second insulation layer.

Figure 9:
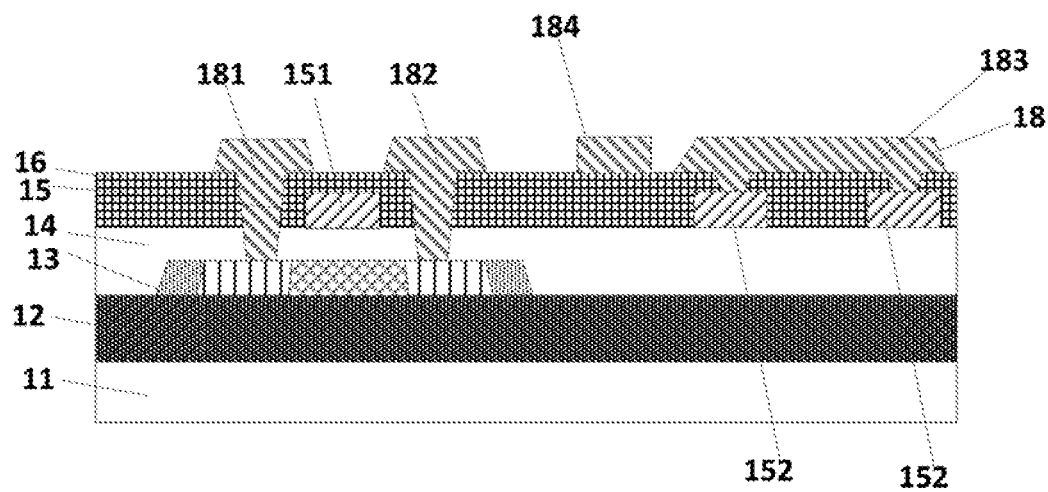
FIG. 9 is a structural schematic diagram of a fourth step of the manufacturing method of the display panel of the present disclosure.

Illustrated in FIG. 9 is depositing the second metal layer 8 on the second insulation layer 19, and performing a patterning process on the second metal layer 18 to obtain the first source electrode 181, the first drain electrode 182, the second gate electrode 183, and the second connection part 184. A material of the second metal layer 18 may include at least one of Mo, Al, or Cu.

S105: manufacturing a metal oxide semiconductor layer on the first source electrode and the first drain electrode.

Figure 10:
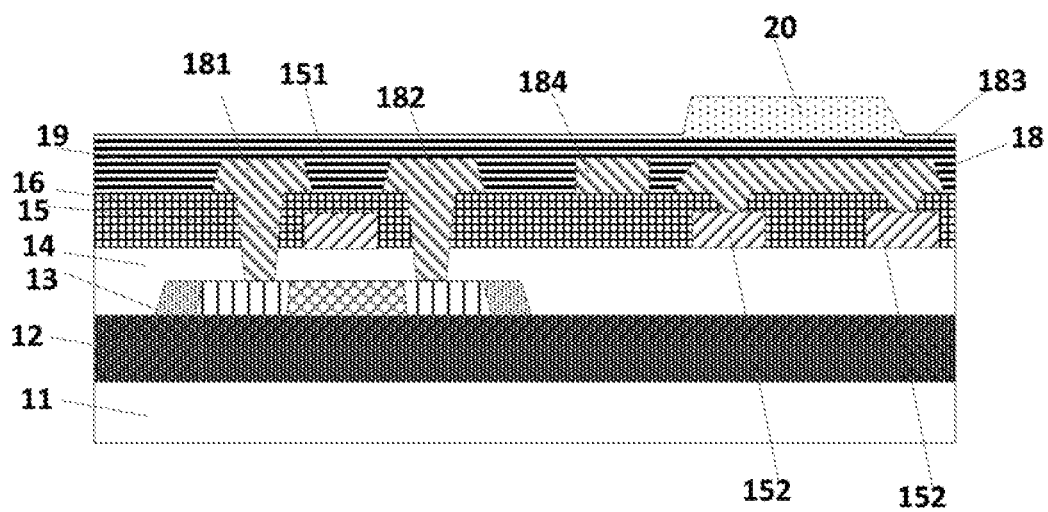
FIG. 10 is a structural schematic diagram of a fifth step of the manufacturing method of the display panel of the present disclosure.

Illustrated in FIG. 10 is manufacturing the second insulation layer 19 on the first source electrode 181, the first drain electrode 182, the second gate electrode 183, and the second connection part 184, and afterwards depositing the metal oxide semiconductor layer 20 on the second insulation layer 19 and performing a patterning process on it to obtain a required pattern A material of the metal oxide semiconductor layer 20 includes one of indium gallium zinc oxide (IGZO), indium gallium zinc tin, oxide (IGZTO), or indium tin zinc oxide (ITZO).

S106: manufacturing a third insulation layer on the metal oxide semiconductor layer.

Figure 11:
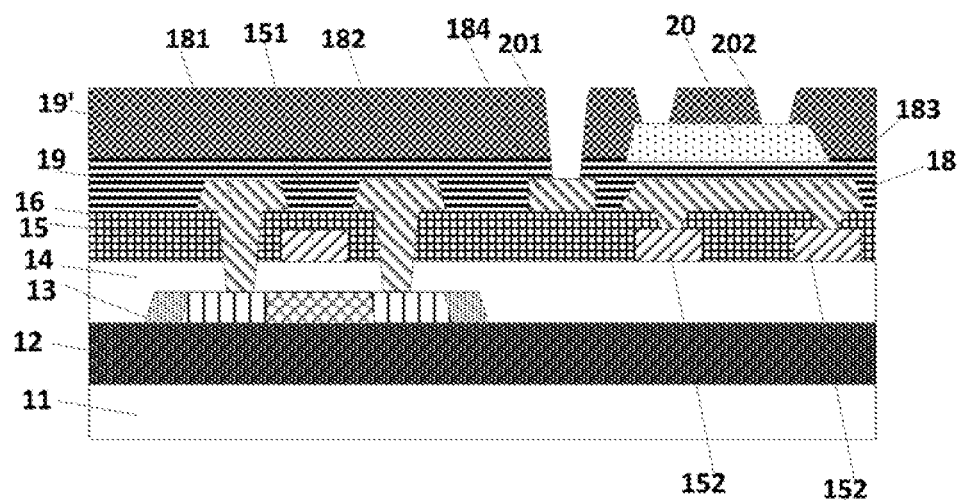
FIG. 11 is a structural schematic diagram of a sixth step of the manufacturing method of the display panel of the present disclosure.

Illustrated in the FIG. 11 is manufacturing the third insulation layer 19' on the metal oxide semiconductor layer, wherein two second contact holes 201 and two second connection holes 202 are manufactured on the third insulation layer 19'. The second source electrode 221 is connected to the second connection pan 184 through the second contact hole 201. The second source electrode 221 and the second drain electrode 222 are connected to the metal oxide semiconductor layer 20 through one second connection hole 202. It can be understood that a number of the second contact holes and a number of the second connection holes are not limited thereto.

S107: manufacturing a third metal layer on the third insulation layer.

Back to FIG. 4, the third metal layer 22 is manufactured on the third insulation layer 19'. The second source electrode 221 and the second drain electrode 222 are obtained by performing a patterning process on the third metal layer 22. A material of the third metal layer 22 may include at least one of Mo, Al, or Cu. The method can further include:

S108: manufacturing a pixel electrode on the third metal layer, wherein the pixel electrode is connected to the second drain electrode through the second contact hole.

For example, manufacturing a planarization layer on the third metal layer, manufacturing via holes on the planarization layer, manufacturing the pixel electrode in the planarization layer and the via holes, and the pixel electrode is connected to the second drain electrode 222 through the via holes.

The present disclosure further provides an electronic device, which includes any one of the display panels mentioned above. The electronic device may be a mobile phone, a tablet PC, or other electronic products.

Figure 12:
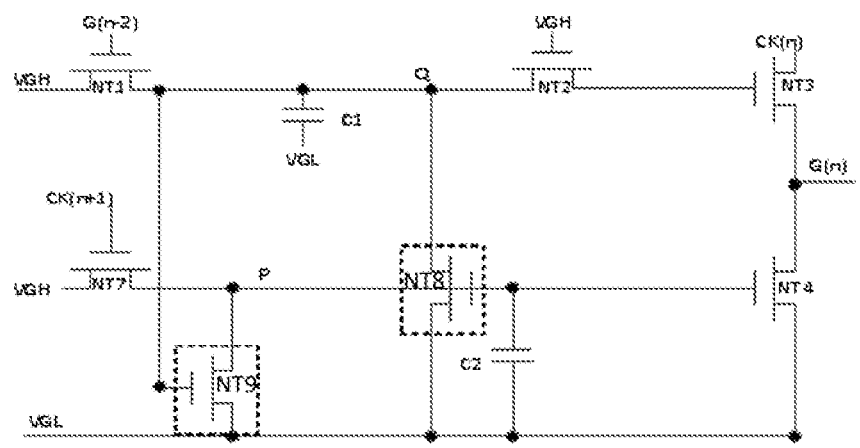
FIG. 12 is a structural schematic diagram of a gate electrode driving circuit of the present disclosure.

As illustrated in FIG. 12, the present disclosure further provides a gate electrode driving circuit, which includes a plurality of cascading gate electrode driving units. An nth stage gate electrode driving unit includes a first thin film transistor NIL a second, thin film transistor NT2, a third thin film transistor NT3, a fourth thin film transistor NT4, a fifth thin film transistor NT8, a sixth thin film transistor NT9, and a seventh thin film transistor NT7.

Furthermore, a gate electrode of the first thin film transistor NT1 is input an n–2th stage scanning signal G(n–2), a source electrode of the first thin film transistor is input a first power source voltage VGH, and a drain electrode of the first thin film transistor is connected to a first node Q.

A gate electrode of the second thin film transistor NT2 is input the first power source voltage VGH. A source electrode of the second thin film transistor NT2 is connected to the first node Q. A drain electrode of the second thin film transistor NT2 is connected to a gate electrode of a third thin film transistor NT3.

A source electrode of the third thin film transistor NT3 is input an nth stage clock signal CK(n), a drain electrode of the third thin film transistor NT3 is connected to a first output end, wherein the first output end outputs an nth stage scanning signal G(n).

A gate electrode of the seventh thin film transistor NT7 is input an n+1th stage clock signal CK(n+1). A source electrode of the seventh thin film transistor NT7 is input the first power source voltage VGH. A drain electrode of the seventh thin film transistor NT7 is connected to a second node P.

A gate electrode of the fourth thin film transistor NT4 is connected to the second node P. A drain electrode of the fourth thin film transistor NT4 is connected to the first output end. A source electrode of the fourth thin film transistor NT4 is input the second power source voltage VGL.

A gate electrode of the fifth thin film transistor NT8 is connected to the second node P. A drain electrode of the fifth thin film transistor NT8 is connected to the first node Q. A source electrode of the fifth thin film transistor NT8 is input the second power source voltage VGL.

A gate electrode of the sixth thin film transistor NT9 is connected to the drain electrode of the first thin film transistor NT1. A drain electrode of the sixth thin film transistor NT9 is connected to the second node P. A source electrode of the sixth thin film transistor NT9 is input a second power source voltage VGL.

Furthermore, the fifth thin film transistor NT8 is used to drop down an electric potential of the node Q, and the sixth thin film transistor NT9 is used to drop down an electric potential of the node P.

Furthermore, a material of a semiconductor layer of the fifth thin film transistor NT8 and/or a material of a semiconductor layer of the sixth thin film transistor NT9 are metal oxides. A material of a semiconductor layer of the first thin film transistor NT1, a material of a semiconductor layer of the second thin film transistor NT2, a material of a semiconductor layer of the third thin film transistor NT3, a material of a semiconductor layer of the fourth thin film transistor NT4, and a material of a semiconductor layer of the seventh thin film transistor NT7 are polycrystalline silicon.

That is, polycrystalline silicon thin film transistors are used as the first thin film transistor, the second thin film transistor, the third thin film transistor, the fourth thin film transistor and the seventh thin film transistor, and the metal oxide thin film transistor is used as the fifth thin film transistor and/or the sixth thin film transistor.

In an embodiment, combined with FIG. 12 and FIG. 4, the semiconductor layer of the first thin film transistor NT1, the semiconductor layer of the second thin film transistor NT2, the semiconductor layer of the third thin film transistor NT3, the semiconductor layer of the fourth thin film transistor NT4, and the semiconductor layer of the seventh thin film transistor NT7 are located on the polycrystalline silicon semiconductor layer 13.

The gate electrode of the first thin film transistor NT1, the gate electrode of the second thin film transistor NT2, the gate electrode of the third thin film transistor NT3, the gate electrode of the fourth thin film transistor NT4, and the gate electrode of the seventh thin film transistor NT7 are located on the first metal layer 15.

The source electrode and the drain electrode of the first thin film transistor NT1, the source electrode and the drain electrode of the second thin film transistor NT2, the source electrode and the drain electrode of the third thin film transistor NT3, the source electrode and the drain electrode of the fourth thin film transistor NT4, the source electrode and the drain electrode of the seventh thin film transistor NT7, and the gate electrode of the fifth thin film transistor NT8 and/or the gate electrode of the sixth thin film transistor NT9 are located on the second metal layer 18.

Furthermore, the semiconductor layer of the fifth thin film transistor NT8 and/or the semiconductor layer of the sixth thin film transistor NT9 are located on the metal oxide semiconductor layer 20.

The source electrode and the drain electrode of the fifth thin film transistor NT8 and/or the source electrode and the drain electrode of the sixth thin film transistor NT9 are located on the third metal layer 22.

In an embodiment, the first metal layer 15, the second metal layer 18, the metal oxide semiconductor layer 20, and the third metal layer 22 are sequentially disposed on the polycrystalline silicon semiconductor layer 13.

The polycrystalline silicon thin film transistors mentioned above can be used on the first thin film transistor NT1 to the fourth thin film transistor NT4 and the seventh thin film transistor NT7 in FIG. 12, and the metal oxide thin film transistor mentioned above can be used on at least one of the fifth thin film transistor NT8 or the sixth thin film transistor NT9 in FIG. 12.

Because the metal oxide thin filial transistor is used on the fifth thin film transistor NT8 in the gate electrode driving region, an off-state current of the fifth thin film transistor NT8 is less than a preset value. Therefore, a leakage current can be reduced to improve stage transfer stability and display effect of the gate on array (GOA). In addition, when the metal oxide thin film transistor is used on the sixth thin film transistor NT9 its the gate electrode driving region, an off-state current $I_{off}$ of the sixth thin film transistor NT9 can be reduced to improve stability of outputting signals and display effect of the GOA.

The present disclosure provides the display panel, the gate electrode driving circuit, and the electronic device. The display panel includes the gate electrode driving region. The gate electrode driving region includes the polycrystalline silicon semiconductor layer; the first metal layer disposed on the polycrystalline silicon semiconductor layer, wherein the first metal layer includes the first gate electrode; the second metal layer disposed on the first metal layer, wherein the second metal layer includes the first source electrode, the first drain electrode, and the second gate electrode, and two ends of the polycrystalline silicon semiconductor layer are electrically connected to the first source electrode and the first drain electrode respectively; and the third metal layer disposed on the metal oxide semiconductor layer, wherein the third metal layer includes the second source electrode and the second drain electrode, and two ends of the metal oxide semiconductor layer are electrically connected to the second source electrode and the second drain electrode respectively. Because the metal oxide semiconductor layer is added, an off-state current of the corresponding thin film transistor is less than a preset value. Therefore, a leakage current is reduced, which can improve stage transfer stability of the GOA circuit and can prevent failure of, the GOA circuit and occurrence of a split screen phenomenon, thereby improving display effect.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display panel, comprising a gate electrode driving region, wherein a sectional structure of the gate electrode driving region comprises:

a polycrystalline silicon semiconductor layer;

a first metal layer disposed on the polycrystalline silicon semiconductor layer, wherein the first metal layer comprises a first gate electrode and at least one first connection part;

a second metal layer disposed on the first metal layer, wherein the second metal layer comprises a first source electrode, a first drain electrode, and a second gate electrode, two ends of the polycrystalline silicon semiconductor layer are electrically connected to the first source electrode and the first drain electrode respectively, and the second gate electrode is connected to the first connection part;

a metal oxide semiconductor layer disposed on the second metal layer; and a third metal layer disposed on the metal oxide semiconductor layer, wherein the third metal layer comprises a second source electrode and a second drain electrode, and two ends of the metal oxide semiconductor layer are electrically connected to the second source electrode and the second drain electrode respectively.

2. The display panel as claimed in claim 1, wherein a material of the metal oxide semiconductor layer comprises one of indium gallium zinc oxide (IGZO), indium gallium zinc tin oxide (IGZTO), or indium tin zinc oxide (ITZO).

3. The display panel as claimed in claim 1, wherein the gate electrode driving region comprises:
  a gate insulation layer disposed between the first metal layer and the second metal layer, wherein a first connection hole is defined on the gate insulation layer, and the second gate electrode is connected to the first connection part through the first connection hole.

4. The display panel as claimed in claim 1, wherein the second metal layer comprises at least one second connection part, and the second source electrode and/or the second drain electrode are connected to one of the second connection part.

5. The display panel as claimed in claim 4, wherein the gate electrode driving region comprises:
  a second insulation layer disposed between the second metal layer and the metal oxide semiconductor layer, at least one second connection hole is defined on the second insulation layer; and
  a third insulation layer disposed between the metal oxide semiconductor layer and the third metal layer, and the second connection hole penetrates the second insulation layer and the third insulation layer.

6. A gate electrode driving circuit, comprising a plurality of cascading gate electrode driving units, wherein an nth stage gate electrode driving unit comprises:
  a first thin film transistor, a second thin film transistor, a third thin film transistor, a fourth thin film transistor, a fifth thin film transistor, a sixth thin film transistor, and a seventh thin film transistor;
  a gate electrode of the first thin film transistor is input an n−2th stage scanning signal, a source electrode of the first thin film transistor is input a first power source voltage, and a drain electrode of the first thin film transistor is connected to a first node;
  a gate electrode of the second thin film transistor is input the first power source voltage, a source electrode of the second thin film transistor is connected to the first node, and a drain electrode of the second thin film transistor is connected to a gate electrode of the third thin film transistor;
  a source electrode of the third thin film transistor is input an nth stage clock signal, a drain electrode of the third thin film transistor is connected to a first output end, wherein the first output end is used to output the nth stage scanning signal;
  a gate electrode of the seventh thin film transistor is input an n+1 th stage clock signal, a source electrode of the seventh thin film transistor is input the first power source voltage, and a drain electrode of the seventh thin film transistor is connected to a second node;
  a gate electrode of the sixth thin film transistor is connected to the drain electrode of the first thin film transistor, a drain electrode of the sixth thin film transistor is connected to the second node, and a source electrode of the sixth thin film transistor is input a second power source voltage;
  a gate electrode of the fifth thin film transistor is connected to the second node, a drain electrode of the fifth thin film transistor is connected to the first node, and a source electrode of the fifth thin film transistor is input the second power source voltage; and
  a gate electrode of the fourth thin film transistor is connected to the second node, a drain electrode of the fourth thin film transistor is connected to the first output end, and a source electrode of the fourth thin film transistor is input the second power source voltage, wherein a material of a semiconductor layer of the fifth thin film transistor and/or a material of a semiconductor layer of the sixth thin film transistor are metal oxides, a material of a semiconductor layer of the first thin film transistor, a material of a semiconductor layer of the second thin film transistor, a material of a semiconductor layer of the third thin film transistor, a material of a semiconductor layer of the fourth thin film transistor, and a material of a semiconductor layer of the seventh thin film transistor are polycrystalline silicon.

7. The gate electrode driving circuit as claimed in claim 6, wherein
  the semiconductor layer of the first thin film transistor, he semiconductor layer of the second thin film transistor, he semiconductor layer of the third thin film transistor, he semiconductor layer of the fourth thin film transistor, and he semiconductor layer of the seventh thin film transistor are located on the polycrystalline silicon semiconductor layer;
  the gate electrode of the first thin film transistor, the gate electrode of the second thin film transistor, the gate electrode of the third thin film transistor, the gate electrode of the fourth thin film transistor, and the gate electrode of the seventh thin film transistor are located on the first metal layer;
  the source electrode and the drain electrode of the first thin film transistor, the source electrode and the drain electrode of the second thin film transistor, the source electrode and the drain electrode of the third thin film transistor, the source electrode and the drain electrode of the fourth thin film transistor, the source electrode and the drain electrode of the seventh thin film transistor, and the gate electrode of the fifth thin film transistor and/or the gate electrode of the sixth thin film transistor are located on the second metal layer;
  wherein the semiconductor layer of the fifth thin film transistor and/or the semiconductor layer of the sixth thin film transistor are located on the metal oxide semiconductor layer; and
  the source electrode and the drain electrode of the fifth thin film transistor and/or the source electrode and the drain electrode of the sixth thin film transistor are located on the third metal layer.

8. The gate electrode driving circuit as claimed in claim 6, wherein
the first metal layer, the second metal layer, the metal oxide semiconductor layer, and the third metal layer are sequentially disposed on the polycrystalline silicon semiconductor layer.

9. The gate electrode driving circuit as claimed in claim 6, wherein the fifth thin film transistor is used to drop down an electric potential of the first node.

10. The gate electrode driving circuit as claimed in claim 6, wherein the sixth thin film transistor is used to dropdown an electric potential of the second node.

11. An electronic device, comprising a display panel comprising a gate electrode driving region, wherein a cross section of the gate electrode driving region comprises:
a polycrystalline silicon semiconductor layer;
a first metal layer disposed on the polycrystalline silicon semiconductor layer, wherein the first metal layer comprises a first gate electrode and at least one first connection part;
a second metal layer disposed on the first metal layer, wherein the second metal layer comprises a first source electrode, a first drain electrode, and a second gate electrode, two ends of the polycrystalline silicon semiconductor layer are electrically connected to the first source electrode and the first drain electrode respectively, and the second gate electrode is connected to the first connection part;
a metal oxide semiconductor layer disposed on the second metal layer; and
a third metal layer disposed on the metal oxide semiconductor layer, wherein the third metal layer comprises a second source electrode and a second drain electrode, and two ends of the metal oxide semiconductor layer are electrically connected to the second source electrode and the second drain electrode respectively.

12. The electronic device as claimed in claim 11, wherein a material of the metal oxide semiconductor layer comprises one of indium gallium zinc oxide (IGZO), indium gallium zinc tin oxide (IGZTO), or indium tin zinc oxide (ITZO).

13. The electronic device as claimed in claim 11, wherein the gate electrode driving region comprises:
a gate insulation layer disposed between the first metal layer and the second metal layer, wherein a first connection hole is defined on the gate insulation layer, and the second gate electrode is connected to the first connection part through the first connection hole.

14. The electronic device as claimed in claim 11, wherein a material of the second metal layer comprises at least one of Mo, Al, or Cu.

15. The electronic device as claimed in claim 11, wherein the second metal layer comprises at least one second connection part, and the second source electrode and/or the second drain electrode are connected to one of the second connection part.

16. The electronic device as claimed in claim 15, wherein the gate electrode driving region comprises:
a second insulation layer disposed between the second metal layer and the metal oxide semiconductor layer, at least one second connection hole is defined on the second insulation layer; and
a third insulation layer disposed between the metal oxide semiconductor layer and the third metal layer, and the second connection hole penetrates the second insulation layer and the third insulation layer.

17. The electronic device as claimed in claim 11, wherein the display panel comprises:
a first insulation layer located between the polycrystalline silicon semiconductor layer and the first metal layer.

18. The electronic device as claimed in claim 17, wherein a material of the first insulation layer comprises at least one of $SiN_x$ or $SiO_2$.

* * * * *